(12) United States Patent
Flickinger et al.

(10) Patent No.: US 6,524,134 B2
(45) Date of Patent: Feb. 25, 2003

(54) PLUGGABLE MODULE AND RECEPTACLE (75) Inventors: Steven L. Flickinger, Hummelstown, PA (US); William Herb, Harrisburg, PA (US); William E. Veith, Hershey, PA (US); Harold W. Kerlin, Port Royal, PA (US); Edward J. Bright, Middletown, PA (US); Dennis L. Kemmick, Columbia, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/949,353

(22) Filed: Sep. 7, 2001

(65) Prior Publication Data

US 2002/0072274 A1 Jun. 13, 2002

Related U.S. Application Data (63) Continuation-in-part of application No. 09/728,708, filed on Dec. 1, 2000.
(60) Provisional application No. 60/192,932, filed on Mar. 29, 2000, and provisional application No. 60/168,475, filed on Dec. 1, 1999.

(51) Int. Cl.$^7$ ............................................. H01R 13/648
(52) U.S. Cl. ...................................................... 439/607
(58) Field of Search ................................ 439/607, 609, 439/352, 357, 610, 939, 954, 571, 572, 573

(56) References Cited

U.S. PATENT DOCUMENTS

| 5,934,940 | A | * | 8/1999 | Maranto et al. | 439/108 |
| 6,050,853 | A | * | 4/2000 | Ando et al. | 439/571 |
| 6,095,862 | A | * | 8/2000 | Doye et al. | 439/138 |
| 6,142,802 | A | * | 11/2000 | Berg et al. | 385/75 |

* cited by examiner

Primary Examiner—Lynn D. Feild
Assistant Examiner—Phuong K T Dinh (57) ABSTRACT

A receptacle for receiving a module and electrically connecting said module to a host circuit board mounted within a chassis of a host system, said chassis having a bezel opening which has an offset a certain distance above said host circuit board: (a) a housing having a front, a back wall, a top wall, a bottom wall, and side walls and defining a cavity for receiving a module, the bottom wall having a bottom opening to receive a receptacle connector, the front having a front opening to receive the module, the walls comprising a conductive material; (b) a plurality of elongated members extending down from the housing past the bottom wall and adapted for electrical connection to a host circuit board such that the walls are electrically connected to the host circuit board; and (c) at least one standoff extending down from the housing, the standoff being more toward the front of the housing than the rear, when the housing is mounted to the host circuit board, the standoff contacts the circuit board and causes the front of the housing to be raised above the rear of the housing, the front of the housing being raised above the host circuit board by a distance approximately the same as that of the offset.

17 Claims, 11 Drawing Sheets

PLUGGABLE MODULE AND RECEPTACLE

CROSS REFERENCE TO RELATED APPLICATIONS

This application is a continuation-in-part based on U.S. application Ser. No. 09/728,708, filed Dec. 1, 2000, which is based on Provisional Application Nos. 60/192,932, filed Mar. 29, 2000, and 60/168,475, filed Dec. 1, 1999. All of the above-identified applications are incorporated herein by reference.

FIELD OF THE INVENTION

The present invention relates generally to electronic connector systems and, more specifically, to low-profile connector systems for pluggable electronic modules, such as transceiver modules for high speed fiber optical communications.

BACKGROUND OF INVENTION

Historically, electrical and opto-electric modules have been connected to printed circuit boards with solder pins. Conventional approaches for soldering the pins to the circuit board include reflow soldering and hand soldering. Although solder reflow is an effective technique for electrically connecting a module to a circuit board, the heat required to achieve reflow tends to be detrimental to heat sensitive components within the module, such as plastic optical components which tend to warp or otherwise distort at high temperatures. Furthermore, to ensure that modules are capable of withstanding the environmental conditions associated with reflow soldering, the industry utilizes high temperature materials that add cost to the modules. Since most modules will be used in more moderate climates (e.g., an air-conditioned office building), the modules are therefore "over-engineered" simply to ensure that they can withstand the reflow soldering process.

To avoid exposing the module to harsh conditions during reflow soldering, often electronic modules are hand soldered instead to a printed circuit board. The need for hand soldering, however, dramatically increases the cost of system comprising such modules.

Aside from the problems associated with soldering the module to the circuit board, there is the added inconvenience that, if a single module fails on a circuit board, which may support many such modules, the entire circuit board must be removed for service.

Therefore, there is a need for a solderless connection of a module to a circuit board. To this end, several pluggable module designs and standards have been introduced in which a pluggable module plugs into a receptacle which is electronically connected to a host circuit board. For example, a well-known type of transceiver developed by an industry consortium is known as a gigabit interface converter (GBIC) or serial optical converter (SOC) and provides an interface between a computer and a data communication network such as Ethernet or Fibre Channel. These standards offer a generally robust design which has been well received in industry.

Although these conventional pluggable designs have been used successfully in the past, they tend to be unsuitable for miniaturization which is an ever-constant objective in the industry. It is desirable to miniaturize transceivers in order to increase the port density associated with the network connection, such as, for example, switch boxes, cabling patch panels, wiring closets, and computer I/O. Recently, a new standard has been promulgated and is referred to herein as the small form factor (SFF) standard which specifies an enclosure height of 9.8 mm and a width of 13.5 mm and a minimum of 20 electrical input/output connections. In addition to miniaturizing the module, it is also desirable to increase its operating frequency. For example, applications are quickly moving from the sub-gigabit realm to well over a gigabit. Conventional pluggable module configurations, however, cannot meet these parameters.

Miniaturizing a module while maintaining or even increasing its operating speed, presents a number of design problems particularly in applications in which data transmission rates are high, e.g., in the range of 1–10 Gbs (Gigabits/second). Of particular concern is reducing electromagnetic interference (EMI) emissions. Due to FCC regulations, there is a need not only to minimize the EMI emissions of the module, but also to contain the EMI emissions of the host system in which the module is mounted regardless of whether a module is plugged in to the receptacle. In conventional designs, this EMI shielding was achieved by using conductive spring-loaded door which was capable of swinging shut and closing the receptacle when the module was removed. Conventional receptacles also had spring clips to ground the receptacles to the opening or "bezel opening" of the host system through which the receptacle protrudes. Providing space for spring-loaded doors and spring clips on the receptacle tends to be problematic if not impossible in miniaturized configurations. Additionally, the small size presents problems in dissipating heat from the module and incorporating traditional mechanisms for ejecting and retaining the module and for electrically connecting the module to the host circuit board.

It has also been found that providing solutions for the aforementioned EMI and miniaturization problems is further complicated by the dimensional various in the industry with respect to bezel opening position vis-a-vis the host circuit board. While many applications require that the bottom of the bezel opening be flush with the top of the circuit board, some applications require that the bezel opening be raised from the top of the host circuit board. For example, the PCI Local Bus Specification, Revision 2.2 specifies that the bottom of the bezel opening must be 0.4±0.1 min above the host circuit board. As used herein, the distance between the bottom of the bezel opening and the top of the host circuit board is refereed to as the "bezel opening offset." To function properly, a suitable receptacle must be able to accommodate this bezel opening offset while also addressing the EMI and miniaturization concerns mentioned above.

Therefore, there is a need for a versatile module design that conforms to the various dimensional standards, while minimizing EMI emissions and providing convenient pluggable operation. The present invention fulfills this need among others.

SUMMARY OF INVENTION

The present invention provides for a pluggable module and receptacle system that facilitates miniaturization and high operating frequencies by effectively shielding EMI emissions to eliminate leaks and conduct EMI to ground, and by synergistically using components to eliminate conventional discrete mechanisms and their attendant bulk. The present invention also provides for a module and receptacle system which is versatile and able to accommodate a variety of dimensional requirements and bezel opening offsets without comprising the EMI shielding and without a substantial change in the components used.

EMI shielding is achieved by implementing one or more features that serve to minimize gaps through which EMI can escape, and/or to enhance grounding of the receptacle. One such feature is a receptacle housing in which all of its sides except the front comprise conductive walls for blocking EMI. This way, when the receptacle is mounted within a host system and is exposed to the host system's internal EMI, all of the housing sides exposed to the EMI, including the back and the bottom, are conductive and thus suitable for conducting the EMI to ground. Preferably, the housing is electrically connected to ground through a number of elongated members. Another feature for minimizing gaps through which EMI can escape is the use of containment members. Containment members extend downward from the receptacle, preferably between elongated members, and essentially form a picket fence along with the elongated members to prevent EMI emissions.

In addition to minimizing gaps through which EMI can escape, the module and receptacle system of the present invention is extremely well suited for conducting EMI to ground. This grounding is achieved principally by grounding contacts on the front end of the module and grounding tabs around the front opening on the receptacle. This way, the grounding contacts provide a grounding path from the module to the receptacle and the grounding tabs, in turn, provide a grounding path from the receptacle to the host chassis. Preferably, the grounding tabs are cut from the receptacle housing walls and elongated such that the grounding tabs are longer than the respective section of the wall from which each grounding tab was derived. Such a configuration prevents the grounding tabs from being deflected into the receptacle cavity. This arrangement is particularly preferably in small form factor configurations in which there is no room in the receptacle cavity to accommodate anything other than the module. To enhance the grounding of the module to the receptacle while the module is being inserted therein, the receptacle housing defines rows of ventilation holes, which, in turn, define ground paths therebetween. By spacing the grounding contacts on the module to correspond to the spacing of the grounding paths on the receptacle, the grounding contacts will slide along the grounding paths during the module's insertion and withdraw from the receptacle, thereby ensuring the module's grounding. Further enhancements to grounding include a latch which serves not only to retain the module within the receptacle, but also to provide a grounding path from the front of the module to the front of the receptacle and to provide an extra picket in the EMI fence as mentioned above.

The receptacle of the present invention is also able to accommodate variations in bezel opening offset while maintaining adequate EMI shielding by tilting the front of the receptacle upward with respect to the host circuit board. It has been found that tilting the receptacle to accommodate bezel opening offset overs a number of advantages over other approaches such as raising the entire receptacle in a parallel orientation with respect to the host circuit board or changing the dimensions of the receptacle entirely.

First, by tilting the front of the receptacle upward, the rear end of the receptacle remains close to the host circuit board, thereby minimizing the gap between the bottom the receptacle and the host circuit board. Minimizing this gap is important in minimizing EMI emissions since the rear of the receptacle contains the receptacle connector which effects the electronic transmissions between the module and the host circuit board. These electrical transmission render the rear of the receptacle especially susceptible to EMI emissions, particularly at high operating frequencies.

Further, since the receptacle must have an opening on its bottom side near its rear to accommodate the receptacle connector, the EMI shielding of the housing is compromised to some degree in this region. Therefore, it is particularly advantageous for the receptacle to be tilted down in the rear to minimize gaps where EMI emissions are particularly high and the receptacle has limited bottom shielding.

Aside from EMI shielding, another advantage of tilting the recepticle such that its rear end remains close to the host circuit board is minimizing the distance the receptacle connector needs to couple signals between the host circuit board and the module. Minimizing this coupling distance is important for operating at high frequencies since longer distances often equate to higher impedance and a general reduction in the electrical performance of the system.

Another advantage of tilting the cage to accommodate different bezel opening offset is the ability to minimize reconfiguring the receptacle and module components. In fact, it has been found that the receptacle may be tiled with just minor modifications to the lower portion of the receptacle. Thus, the receptacle connector and other components of the receptacle remain the same. It is well known that minimizing the number of components used by a system in various applications not only reduces the capital costs of initially tooling the components, but also reduces inventory costs. Furthermore, since many of the same components can be used among the tilted and non-tilted versions of the receptacle, the performance of the receptacle is basically the same among the various versions. For example, since the same receptacle connector can be used, similar impedance and electrical performance between the coupling of the module and the host circuit board can be expected. Consequently, modules perform equally in well in tilted and non-tilted applications. Such similar performance avoids the need to modify the module according to particular bezel opening offset applications. This is a significant advantage as it reduces costs and inventory needs, while increasing reliability and simplicity in the industry.

The module and receptacle system of the present invention also employs components of the receptacle synergistically to avoid separate mechanisms and components which add bulk and cost to the system. For example, rather than using a conventional connector to effect the module's connection to the receptacle connector, a card edge connection configuration is used. Additionally, the ejection mechanism uses a resilient back portion of the receptacle to urge the module out once the latch is released. The more efficient use of components within the module and receptacle provide for the elimination of other components and thus a general reduction in the system's bulk. This naturally facilitates miniaturization which, as mentioned above, is an ever-present objective in module design.

Accordingly, one aspect of the invention is a receptacle having a housing that shields EMI on all sides exposed to the EMI of the host system. In a preferred embodiment, the receptacle comprises: (a) a housing having a front, a back wall, a top wall, a bottom wall, and side walls and defining a cavity for receiving a module, the bottom wall having a bottom opening to receive a receptacle connector, the front having a front opening to receive the module, the walls comprising a conductive material; (b) a plurality of elongated members extending down from the housing past the bottom wall and adapted for electrical connection to a host circuit board such that the walls are electrically connected to the host circuit board; and (c) at least one standoff extending down from the housing, the standoff being more toward the front of the housing than the rear, when the housing is mounted to the host circuit board, the standoff contacts the circuit board and causes the front of the housing to be raised above the rear of the housing, the front of the housing being raised above the host circuit board by a distance approximately that of the bezel opening offset.

Another aspect of the invention is a pluggable module system having the receptacle as described above. In a preferred embodiment, the system comprises: (a) a receptacle mounted to a host circuit board within a chassis of a host system, the chassis having a bezel opening which has an offset a certain distance above the host circuit board, the receptacle comprising a housing having a front and rear, a back wall, a top wall, a bottom wall, and side walls and defining a cavity for receiving a module, the bottom wall having a bottom opening to receive a receptacle connector, the front having a front opening to receive the module, the walls comprising a conductive material and being electrically connected to the host circuit board, the housing also comprising at least one standoff extending down from the housing, the standoff being more toward the front of the housing than the rear, when the housing is mounted to the host circuit board, the standoff contacts the circuit board and causes the front of the housing to be raised above the rear of the housing, the front of the housing being raised above the host circuit board by a distance approximately that of the bezel opening offset; (b) a receptacle connector electrically connecting to the host circuit board and protruding into the cavity through the bottom opening, the receptacle connector being adapted for electrically connecting the module to the host circuit board; and (c) a module comprising a module housing having a front end and a back end and being adapted for insertion into the receptacle and grounding contacts configured for electrical connection to the housing of the receptacle.

Yet another aspect of the invention is a module which eliminates the use of a conventional connector and uses instead a card edge connection approach. In a preferred embodiment, the module comprises: (a) a housing having a front end and a back end and being adapted for insertion into a housing mounted to the host circuit board; (b) a module circuit board at least partially mounted within the housing such that at least an edge portion of the circuit board is not contained within the housing, the edge portion comprising pads on opposing sides of the module circuit board, the pads being suitable for forming an electrical connection with contacts in the mating connector.

DESCRIPTION OF THE PREFERRED EMBODIMENT

Figure 1:
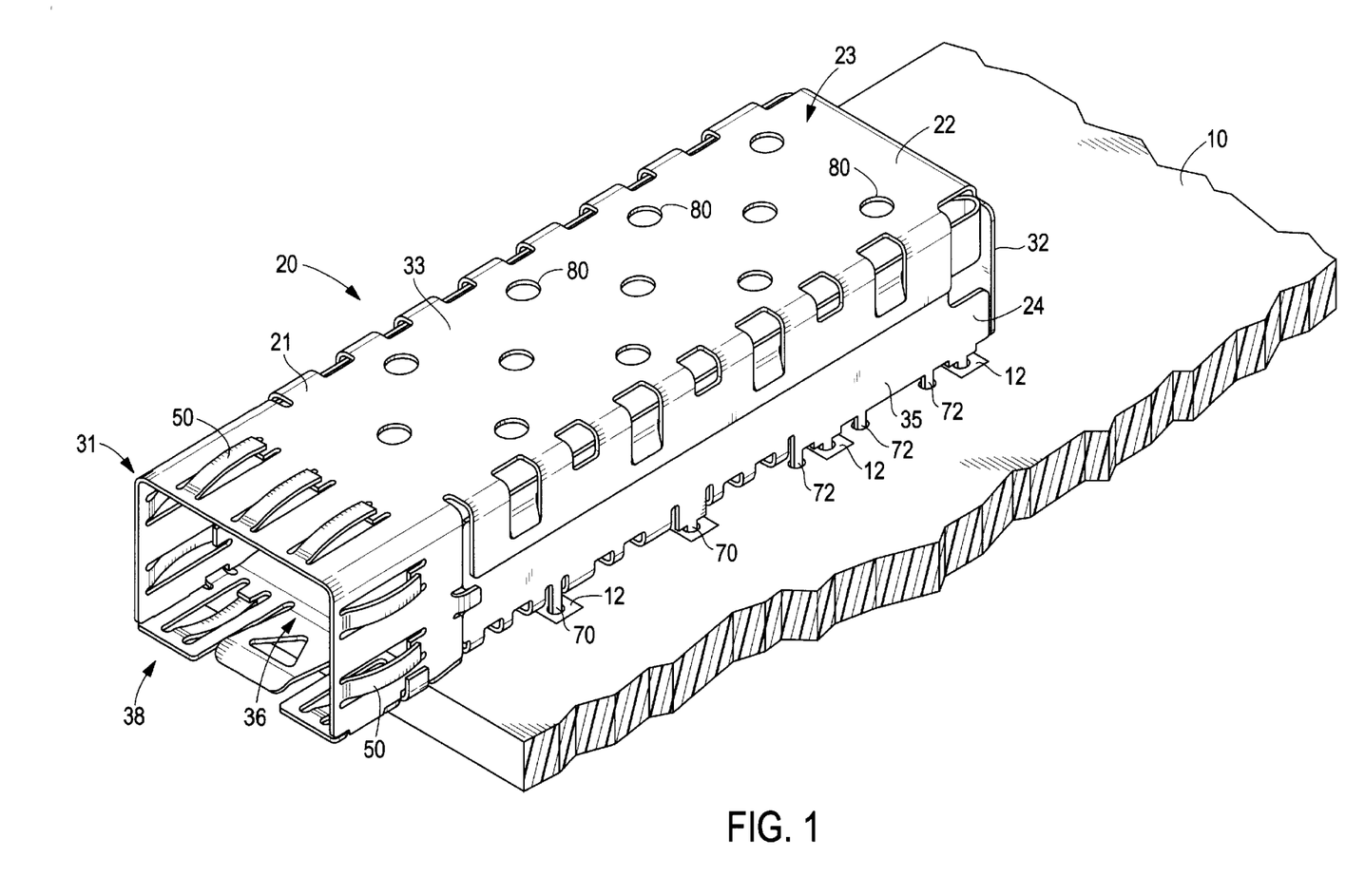
FIG. 1 shows a top perspective view of the shield as mounted on a host circuit board.

The present invention provides a robust module and receptacle system which is suitable for miniaturization and which provides adequate EMI shielding and ventilation while facilitating easy connection/disconnection to a mating connector. As shown in FIG. 1, a receptacle 20 of the present invention is mounted to a host circuit board 10. The host circuit board is mounted in a host system such as a router or computer. The host system typically comprises a conductive chassis (not shown) having a bezel opening through which the receptacle is mounted such that the receptacle is electrically connected to the bezel. The host system typically has other components mounted to its circuit board which generate EMI that would escape through the bezel opening if not for the receptacle system of the present invention.

Figure 9:
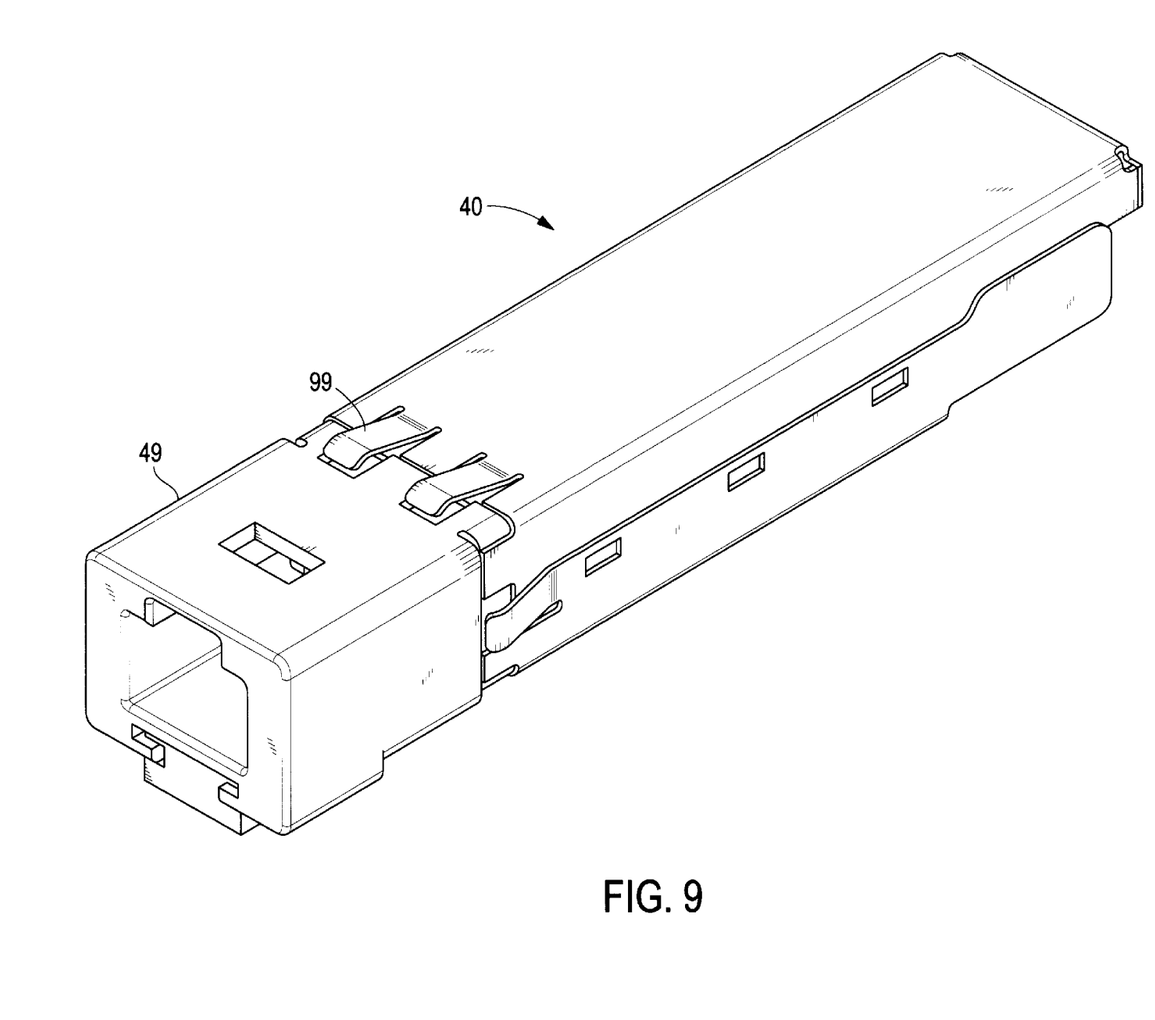
FIG. 9 shows a top perspective view of the module.

The module 40 of the present invention is shown in FIG. 9 and is configured to be inserted in the receptacle 20. In general, the module and receptacle system may be used in any application requiring an interface between a host system and electrical or optical signals. The module interfaces to the host system through a receptacle connector 90 (see FIG. 7). The module interfaces to an optical fiber or electrical conductor through a connector interface 49. Preferably, the connector interface 49 comprises a mechanism that cooperates with a fiber or cable assembly to hold the assembly secure to the module. Examples of connector interfaces include adapters for the MT-RJ style connectors and the Lightray MPX™ line of connectors offered by Tyco Electronics Corporation (Harrisburg, Pa.). The connector interface 49 depicted in FIG. 9 is an adapter interface for an MT-RJ style connector.

Figure 2:
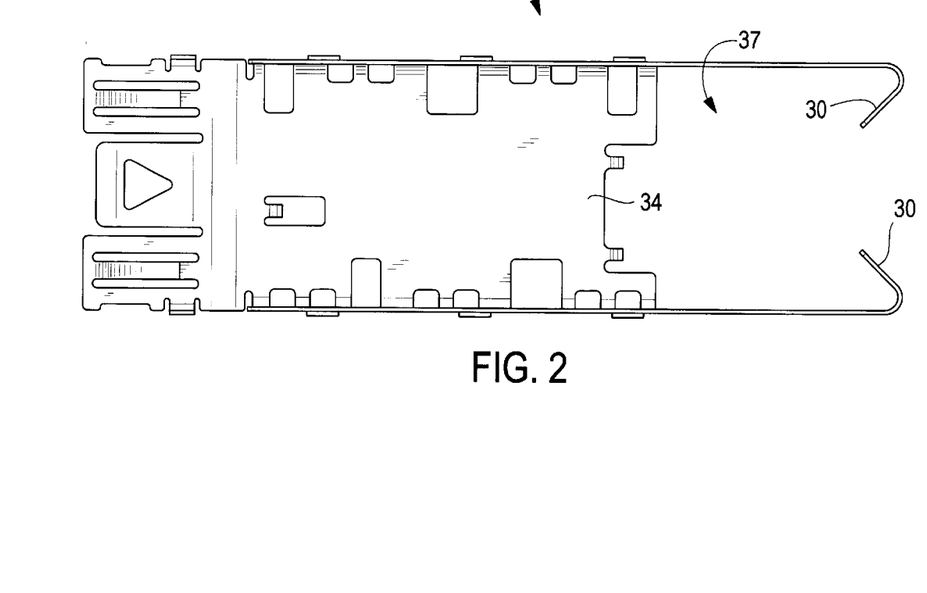
FIG. 2 shows a top view of a lower portion of the shield.
Figure 3:
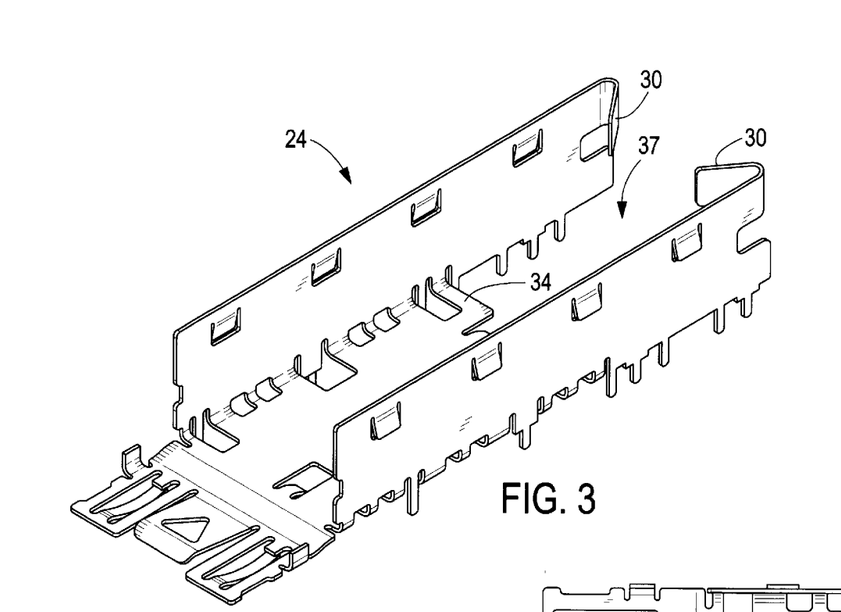
FIG. 3 shows a top perspective view of the lower portion of FIG. 2.

An important aspect of the receptacle and module system of the present invention is its ability to minimize EMI emission regardless of whether the module is plugged in the receptacle. To this end, the system employs a combination of one or more EMI reduction features. One EMI reduction feature is a receptacle housing having conductive walls on all sides that are within the host chassis when the receptacle is mounted therein. As shown in FIG. 1, the receptacle comprises a housing 21, having a front 31, a back wall 32, a top wall 33, a bottom wall 34 (see FIGS. 2 & 3), and side walls 35, and defining a cavity 36 for receiving the module 40. Referring to FIGS. 2 & 3, the bottom wall 34 has a bottom opening 37 to receive a receptacle connector 90 and, referring back to FIG. 1, the front 31 has a front opening 38 to receive the module. Therefore, unlike conventional receptacles, the receptacle of present invention has EMI shielding on all five sides within the host chassis, including the bottom and back. In a preferred embodiment, the back wall fully encloses the back of the receptacle and the bottom wall covers at least about 50% of the bottom of the receptacle.

The receptacle comprises a plurality of elongated members 70 which extend down from the housing past the bottom wall and are electrically connected to the housing. Accordingly, rather than allowing internally-generated EMI to escape though the bezel opening, the EMI is blocked by the conductive walls of the housing and conducted harmlessly to ground via the elongated members 70.

In a preferred embodiment, the housing comprises an upper portion 22 and a lower portion 24, as shown in FIG. 2. The lower portion 24 has tabs 26 punched from the lower portion 24 and deflected outwardly for mating and latching with openings 28 defined by the upper portion 22.

Figure 4:
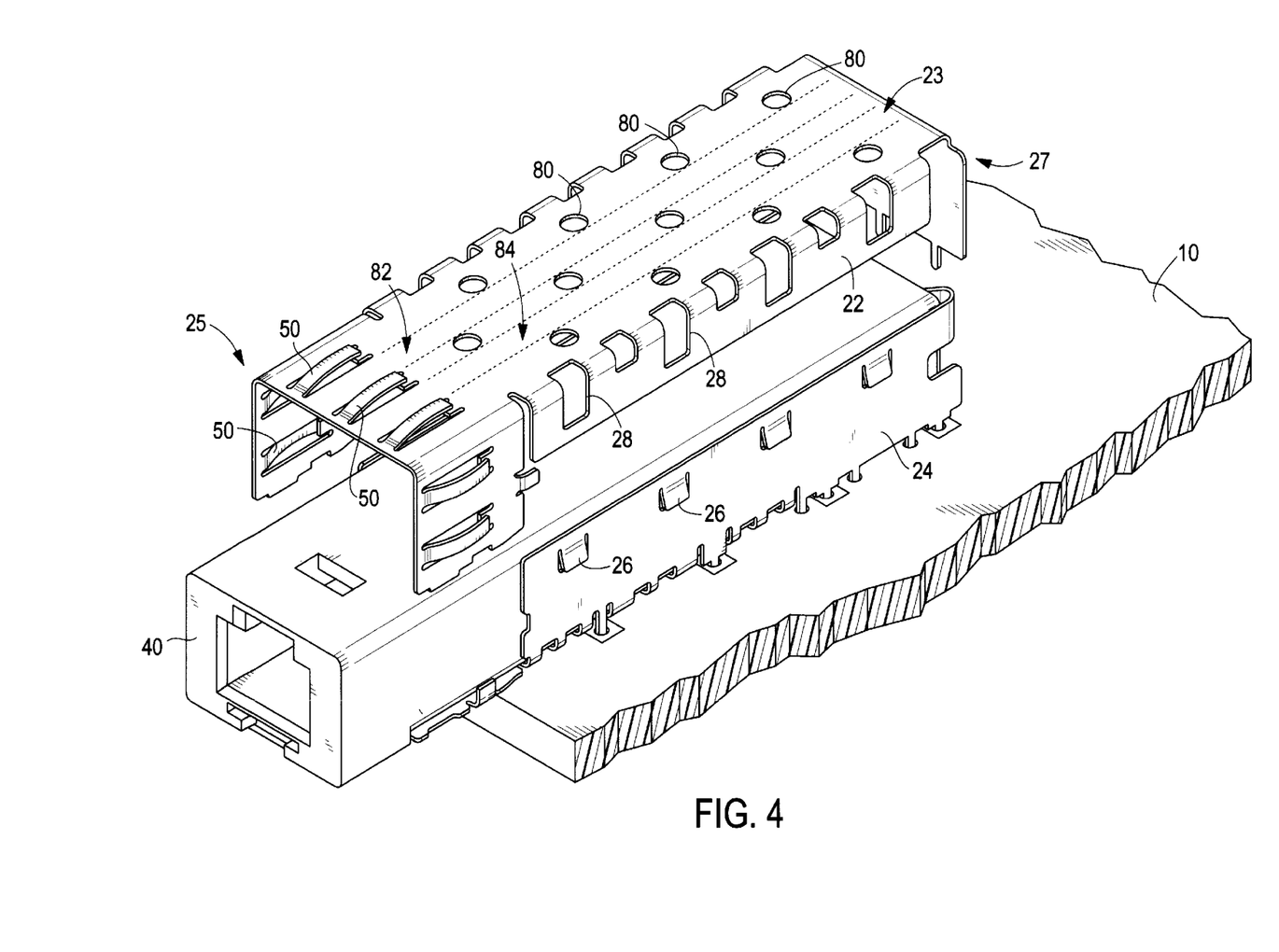
FIG. 4 shows a top perspective view of a module as mounted in a lower portion of the shield, with an upper portion shown removed.

The walls are configured to balance the needs of EMI shielding and heat dissipation. More specifically, as shown in FIGS. 1 and 4, the top wall 33 of the upper portion 22 of the housing 21 defines several holes 80. The holes 80 are sized and configured to promote airflow around the module 40 and enhance heat dissipation. Although enlarging the holes 80 enhances heat dissipation, it reduces the EMI shielding effectiveness of the upper portion 22 which is undesirable. It has been found that holes of approximately 2 to 3 mm in diameter provide adequate heat dissipation for many applications while maintaining adequate EMI shielding.

As mentioned above, the receptacle 20 has elongated members 70, which are preferably solder pins for mounting and electrically coupling the receptacle 20 to contacts 12 of a printed circuit board 10 as shown in FIG. 1. Additionally, the receptacle 20 has containment members 72 extending from the portion into a plane of the printed circuit board 10. The containment members 72 are not electrically coupled to the printed circuit board 10. The containment members 72 may be positioned where suitable so as not to interfere with traces (not shown) of the printed circuit board 10, although the containment members 72 are advantageously spaced among the elongated members 70 and generally in alignment therewith, as shown in FIG. 1. In effect, the elongated members 70 and containment members 72 act as a fence to contain EMI. In the embodiment shown in FIG. 1, the containment members 72 and elongated members 70 are more closely spaced adjacent the back end than adjacent the front end of the module 40 because the module tends to emit more EMI toward the back end, and because the bottom wall 34 is somewhat comprised toward the back with the bottom opening 37.

Preferably, the elongated members 70 are asymmetrically arranged on each side of the receptacle while the containment members 72 are symmetrically arranged. Furthermore, the containment members 72 preferably extend through less than half of the thickness of the printed circuit board 10. In such a preferred embodiment, two housings may be mounted directly opposite one another on a printed circuit board in a bottom-to-bottom arrangement such that the elongated members will be staggered and will not interfere with one another while the containment members will share the same openings in the printed circuit board but will not contact one another or become electrically coupled.

Figure 6:
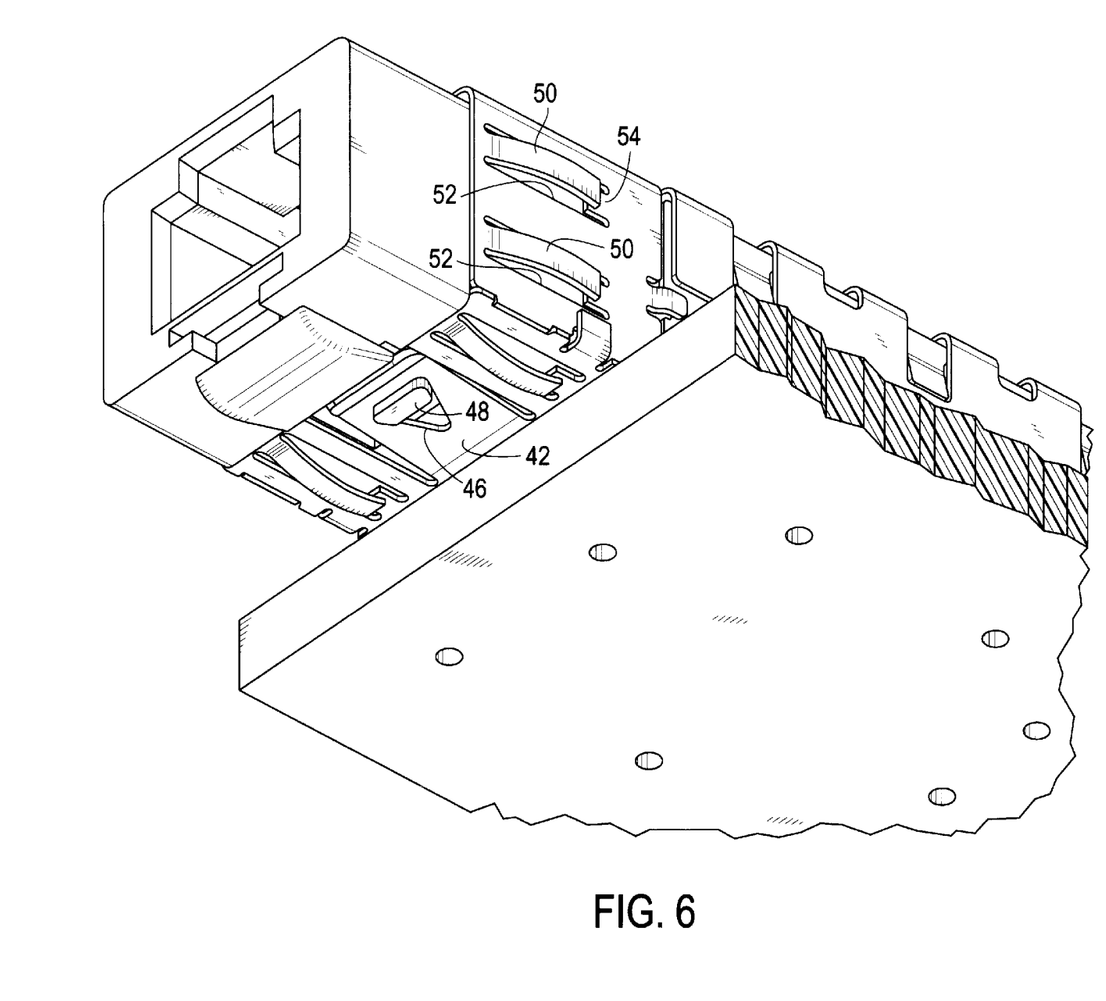
FIG. 6 shows a bottom perspective view of the module latched to the shield.

Another EMI reduction feature of the present invention comprises a multiplicity of grounding tabs surrounding the front opening 38 of the receptacle 20 to ground the receptacle to the host system. Grounding the receptacle to the host system at the bezel is important for EMI purposes—otherwise, internal EMI will "leak" between the gap of the receptacle and the bezel opening. Although grounding shields have traditionally been used to minimize this leakage, once the module 40 is mounted in the receptacle 20 as shown in FIG. 6, there is little or no room for intrusion of grounding tabs into the cavity 36 of the receptacle 20. Accordingly, the receptacle 20 of the present invention has grounding tabs 50 which are larger than adjacent openings 52 in the housing and thus are prevented from being deflected into the cavity 36.

Figure 5:
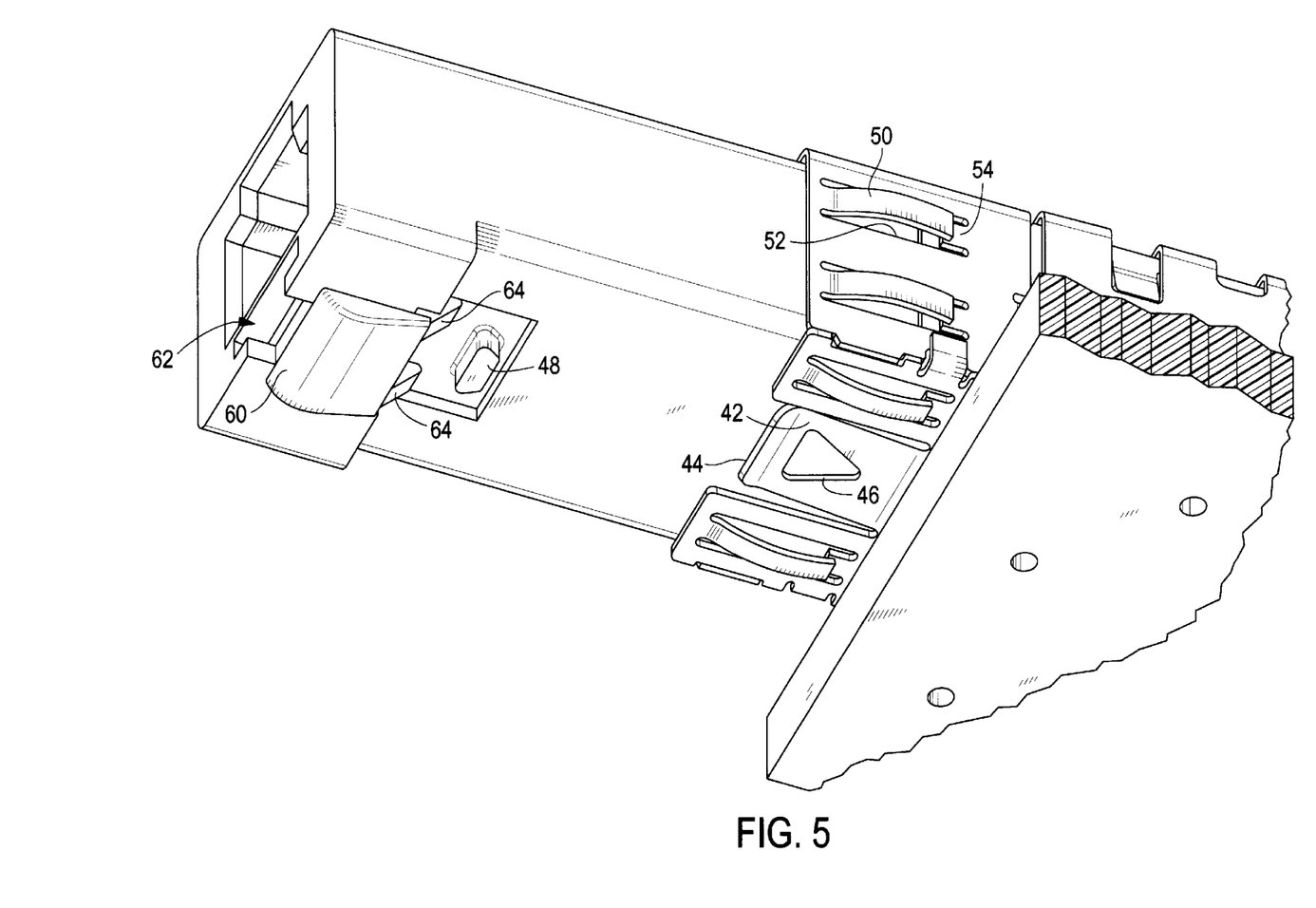
FIG. 5 shows a bottom perspective view of the module before latching to the shield.

The grounding tabs 50, as best shown in FIGS. 5 and 6, are preferably formed from the receptacle 20 by punching two spaced slits in the receptacle 20 to form a strap therebetween, deforming and stretching the strap, cutting the strap along its length to form a grounding tab 50 and an interference tab 54, and returning the interference tab 54 to the plane of the receptacle 20. In this manner, the grounding tab 50 is larger than the adjacent opening 52, thereby allowing the grounding tab 50 to resiliently deflect to ensure good grounding contact with the bezel, but not to the extent of intruding into the cavity 36 of the receptacle 20 due to the interference of the grounding tabs 50 with the interference tabs 54.

Figure 10:
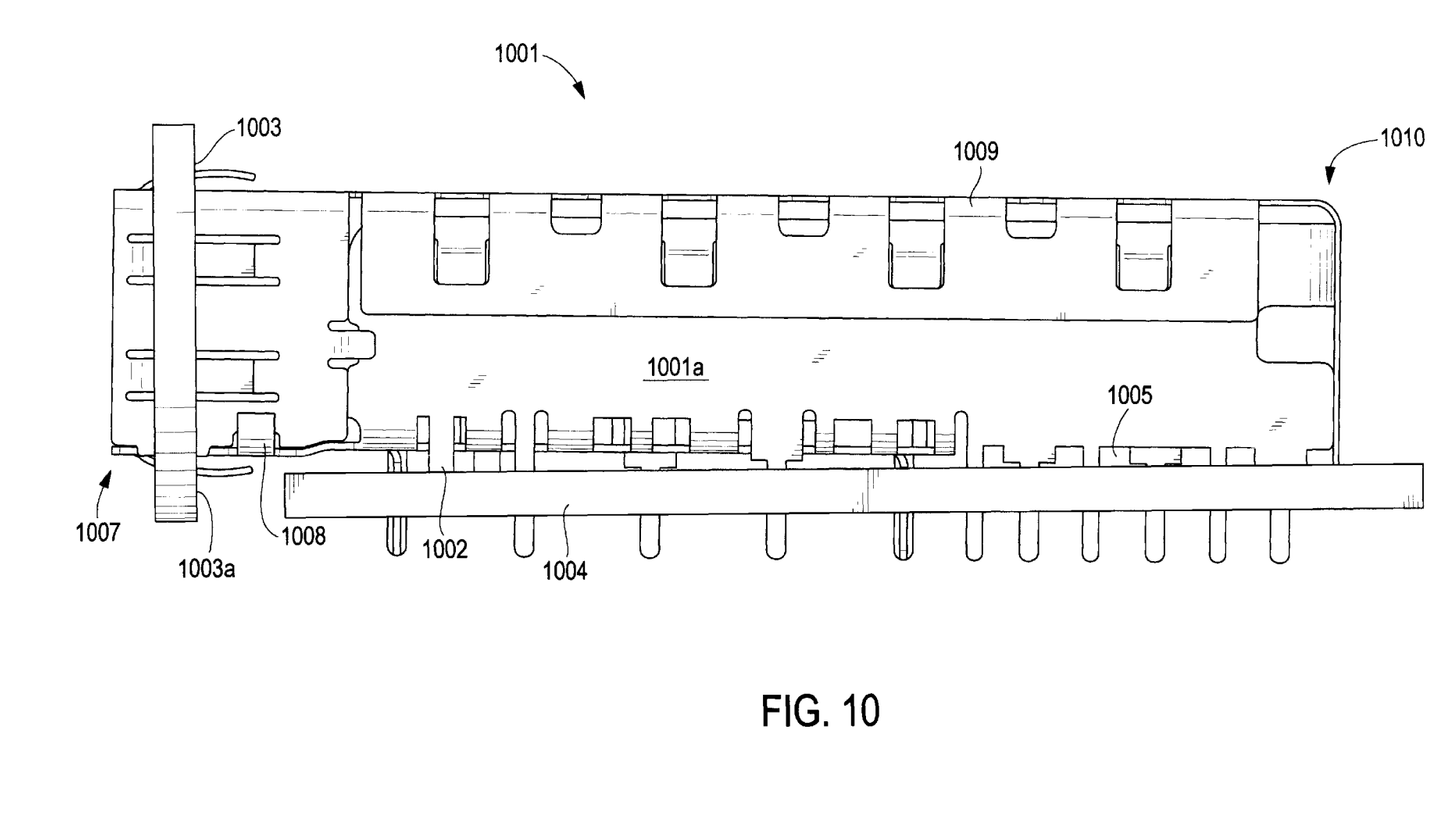
FIG. 10 shows an alternative embodiment of the receptacle which is adapted to tilt to accommodate bezel opening offset.
Figure 11:
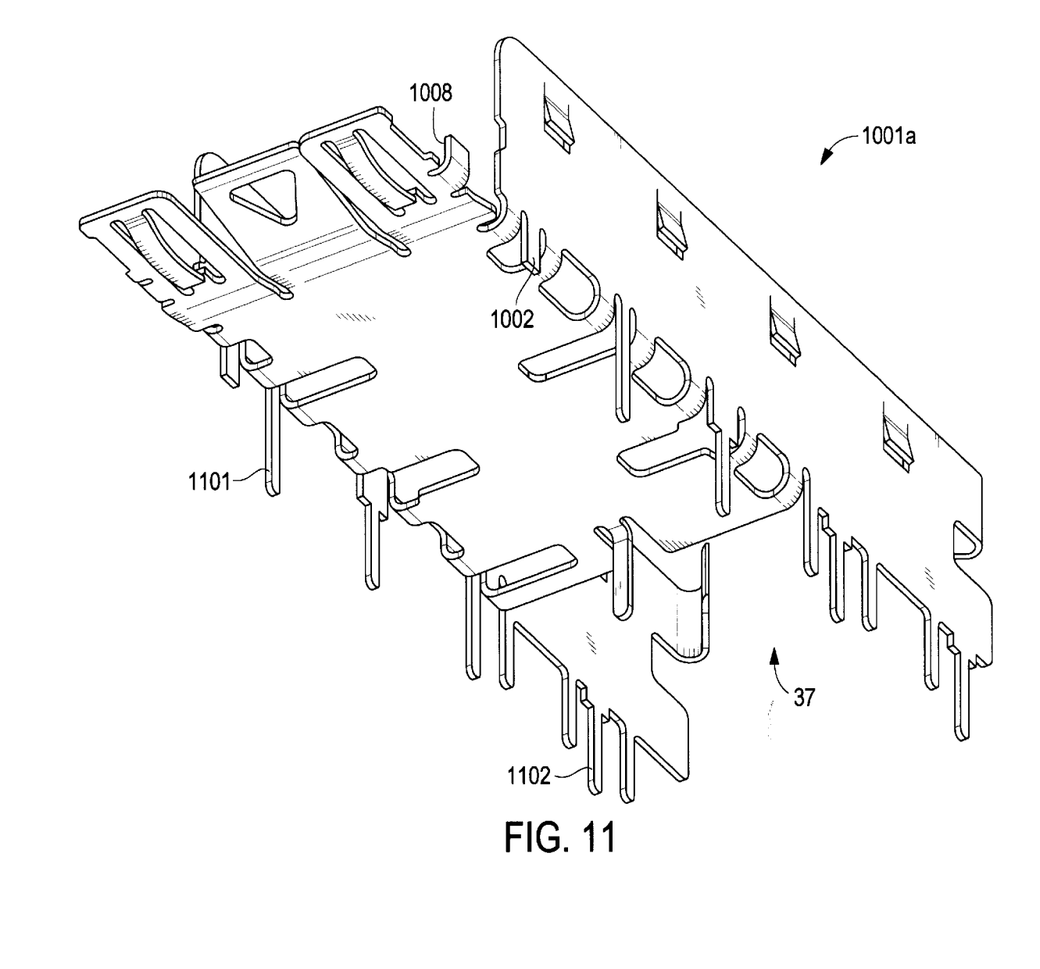
FIG. 11 shows the lower portion of the housing of the receptacle of FIG. 10 suitable for wave solder installation on a host circuit board.
Figure 12:
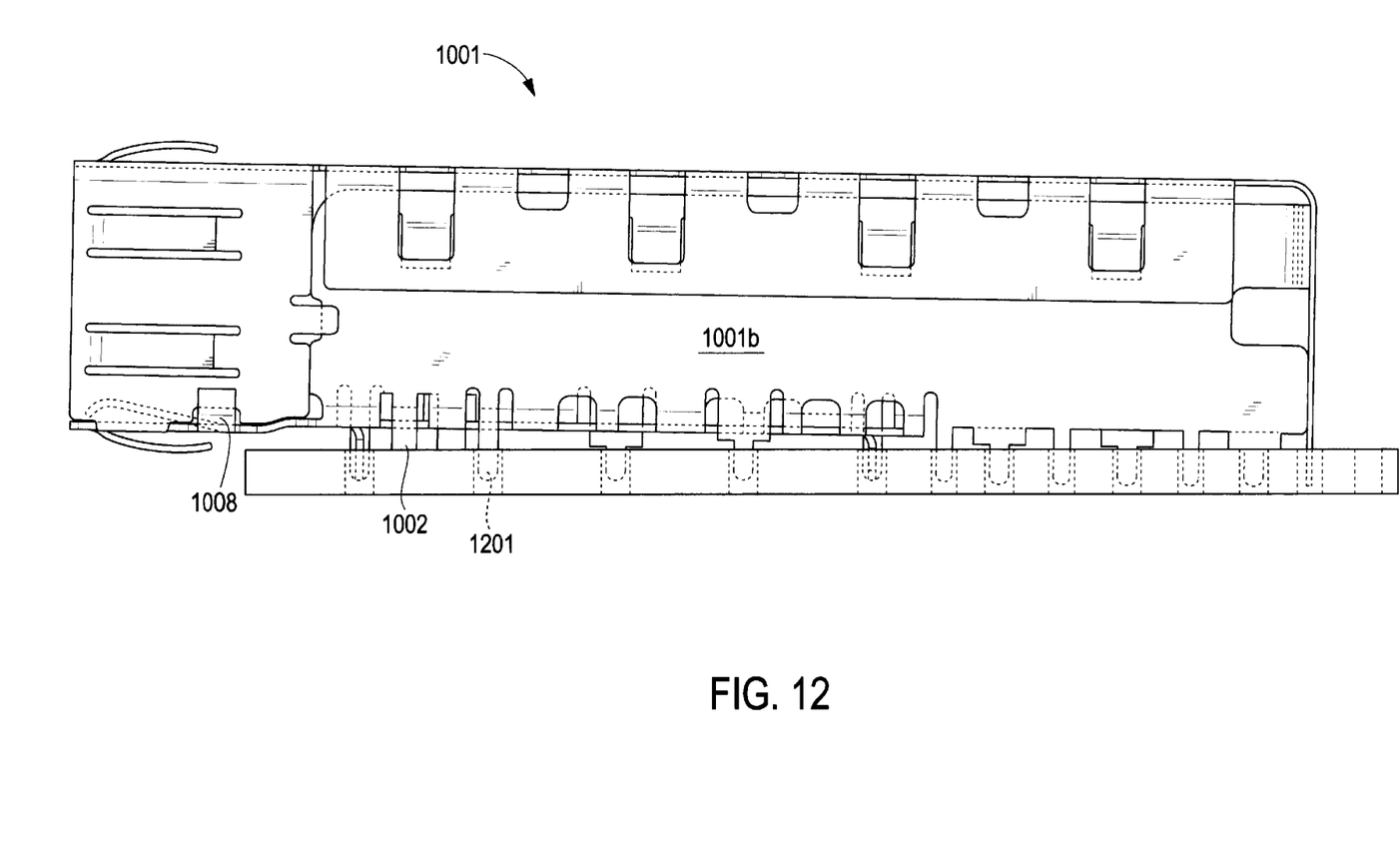
FIG. 12 shows an alternative embodiment of the lower portion of the hosing which is suitable for intrusive reflow installation on a host circuit board.

Referring to FIGS. 10 through 12, a stop 1008 is shown toward the front of the receptacle. The stop 1008 serves to butt up against the chassis around the bezel opening 1003 and prevent the receptacle from being inserted so far through the bezel that the distal ends 50a of the grounding tabs 50 pass out of the bezel opening and thereby act as barbs to prevent withdraw of the receptacle from the bezel opening. It is worthwhile to mention that the stop feature is not specific to the embodiments of FIGS. 10 through 12 and may be applied to the any of the receptacle configurations disclosed herein.

The receptacle and module of the present invention also have features which cooperate with one another to minimize EMI emissions. In general, these features function to provide a grounding path from the module to the chassis. To this end, the module 40 has a number of grounding contacts 99 formed in its housing as shown in FIG. 9. The grounding contacts 99 provide a grounding path from the module to the receptacle, and the grounding tabs 50 on the receptacle 20, in turn, provide a grounding path from the receptacle 20 to the bezel of the host chassis.

To enhance the grounding contacts' connection to the receptacle, the holes 80 are aligned to provide a grounding track for the grounding contacts. As shown in FIG. 4, the holes 80 and module grounding tabs 50 are arranged such that two clear grounding paths 82, 84 extend from the front end 25 to the back end 27 of the top wall 32. This provides a clear path for continuous grounding of the module 40 to the housing 21, which is advantageous for EMI containment purposes. Specifically, the grounding contacts 99 on module 40 are spaced to make contact along the grounding paths 82, 84 in the interior of the receptacle 20. The grounding contacts will maintain grounded contact with the receptacle 20 while the module 40 is being inserted into the receptacle 20.

The grounding of the module to the receptacle is further enhanced by the retention mechanism. As shown in FIGS. 5 & 6, a latch 42 on the receptacle 20 is configured to engage a latching member 48 on the module 40 and hold the module in the receptacle until the latch is released. Preferably, the latch and latching member are conductive such that the latch not only serves to retain the module but also provides yet another grounding path for the module. The placement of the latch under the module where there are no grounding contacts also provides additional "pickets" in the EMI fence as discussed above. The retention mechanism is discussed more specifically below with respect to the ejection mechanism.

Figure 7:
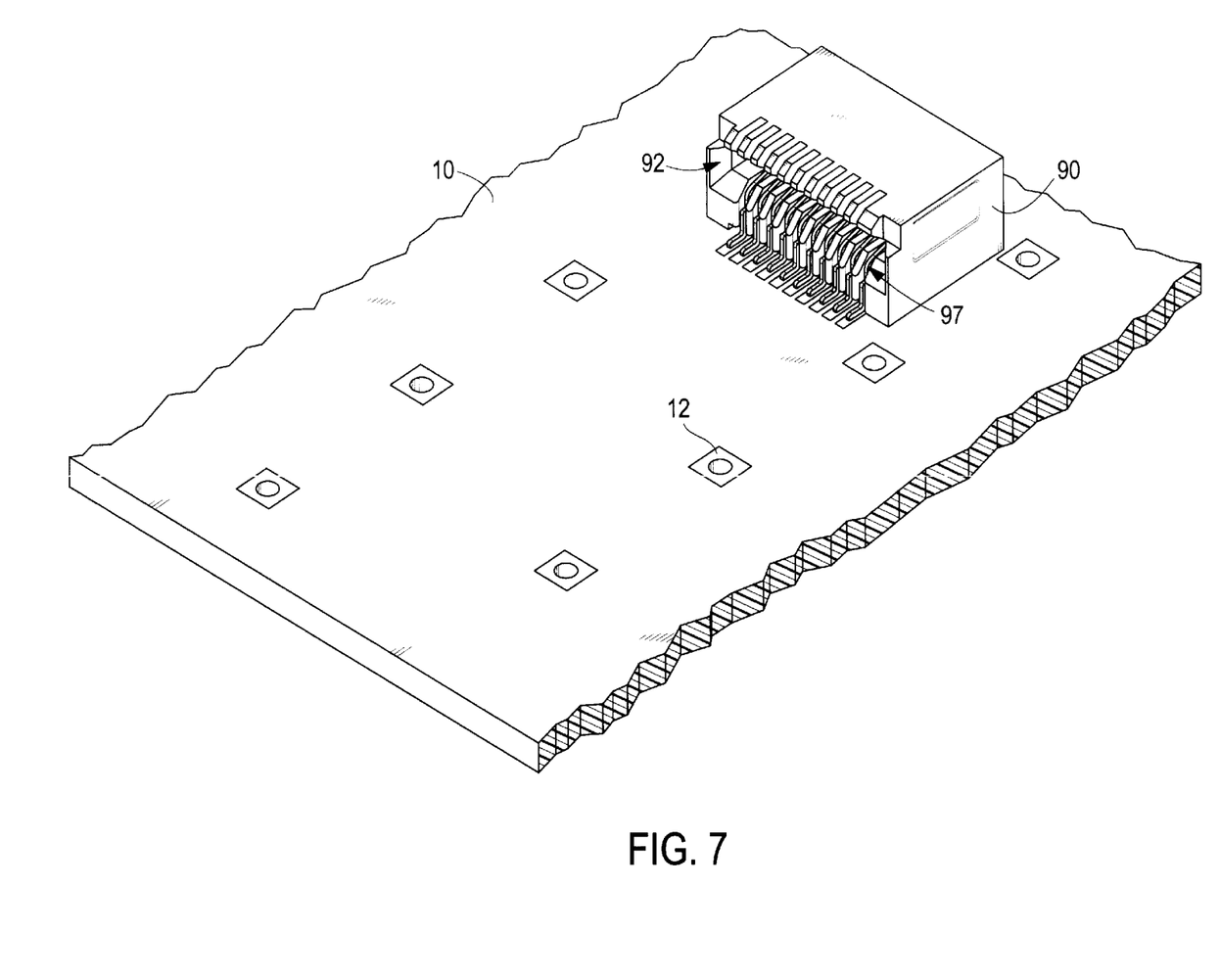
FIG. 7 shows a top perspective view of the host circuit board with a mating connector.
Figure 8A:
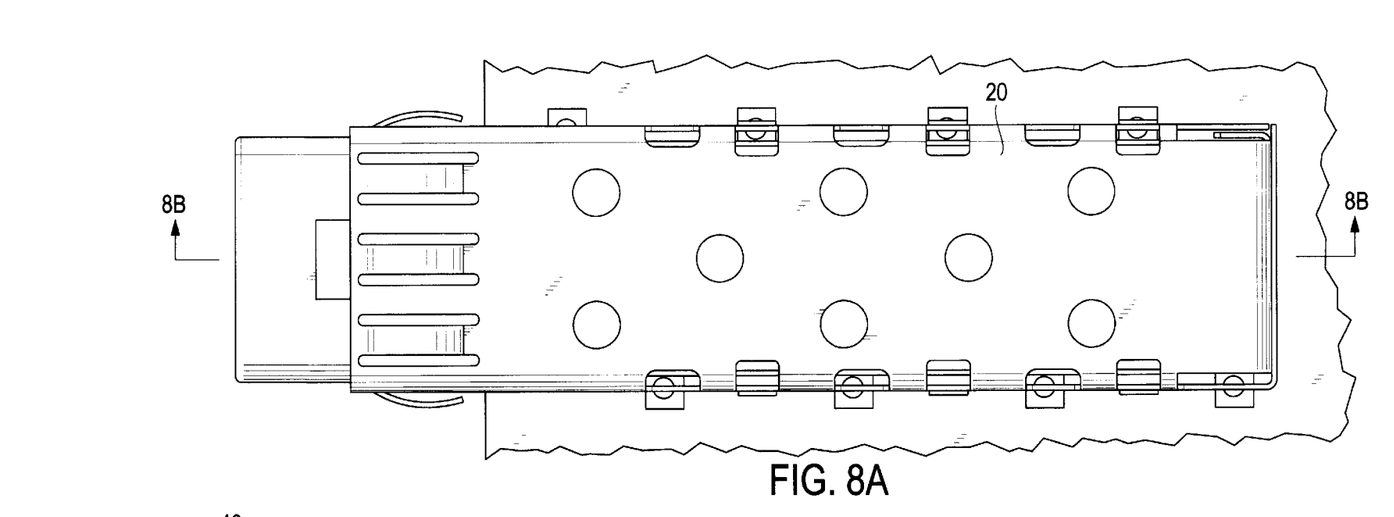
FIGS. 8A and 8B show a top view and a cross-sectional view, respectively, of the transceiver module in the shield such that a circuit board within the transceiver module is electrically connected to the mating connector on the host circuit board.
Figure 8B:
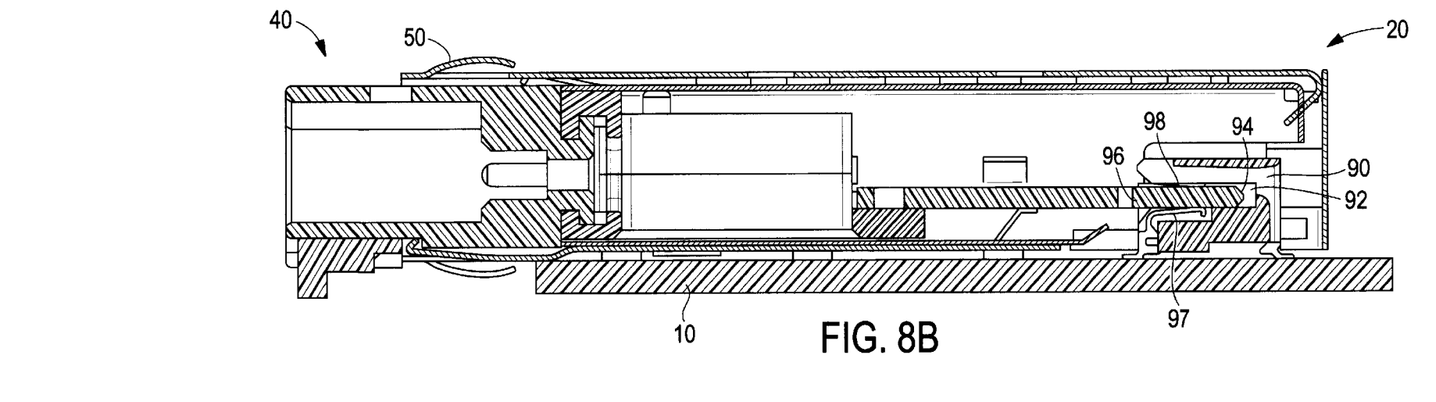

Aside from its EMI and grounding features, the module and receptacle system of the present invention also has a number of mechanical features that enhance its usefulness and make it particularly well suited for miniaturization. One such feature is the use of a card edge connector rather than a conventional discrete connector to electrically connect the module to the receptacle connector. More specifically, as shown in the embodiment of FIGS. 7, 8a and 8b, the receptacle connector 90 is adapted for mounting to the circuit board 10 within the boundaries of the receptacle 20 and has a slot 92 for receiving an edge portion 94 of a module circuit board 96 mounted within a housing of the module 40. The edge portion 94 has a row of contact pads (not shown) along the upper and lower sides of the printed circuit board. The receptacle connector 90 preferably has two rows of contacts, one row of contacts extending upward into the slot 97 and another row of contacts extending downward into the slot 98. The contacts are adapted to make an electrical connection with the contact pads on the module circuit board 96 when the module 40 is inserted into the receptacle 20. This card edge connector arrangement, eliminates the need for a bulky and costly discrete connector and instead provides a low-profile connection that facilitates miniaturization. In addition, this arrangement allows for a pluggable module that may be readily connected and disconnected, e.g., during assembly or for subsequent service.

In one embodiment, the length of the contact pads and/or their proximity to the edge portion of the module circuit board 96 is varied to control the order in which the contact pads electrically couple to the receptacle connector 90. For example, a grounding contact pad could be extended to the edge of the circuit board 96 to ensure that it makes contact with the receptacle connector 90 before the remaining contact pads, which could be spaced from the edge of the circuit board 96 to ensure subsequent contact. In other words, the pads can be staggered to effect a desired sequencing in the ground, power and signal connections. Alternatively, the contacts within the receptacle connector may be staggered to achieve the desired sequencing.

To facilitate miniaturization, the module and receptacle system of the present invention also employs ejection/retention mechanisms which do not add additional components to the system but synergistically use components of the receptacle. More specifically, portions of the lower portion 24 are bent inwardly to form resilient fingers 30 extending into the cavity 39 of the housing 21, as shown in FIGS. 2 and 3. As a module 40 is inserted into the housing 21, as shown in FIG. 4, a back portion (not shown) of the module 40 contacts the resilient fingers 30 and deflects them outwardly. As shown in FIG. 5, the receptacle 20 includes a latch tab 42 having an inclined leading edge 44 and defining an opening 46. As the module 40 is further inserted, the leading edge 44 rides over an outwardly extending latching member 48 of the module 40, causing the latch tab 42 to be resiliently deflected, until the latching member 48 is positioned to enter the opening 46, at which time the latch tab 42 resiles, or snaps back, and latches the module 40 to the receptacle 20, as shown in FIG. 6.

In one embodiment, the latching member 48 is configured as a shear pin to prevent damage to the housing in the event of excessive force exerted on the module 40, e.g., by pulling on a cable attached thereto. This may be achieved, for example, by fabricating the latching member of an appropriate material or by sizing of the latching member to achieve the desired shear characteristics. In this embodiment, the latching member 48 will break and prevent damage to the housing and the printed circuit board on which the housing is mounted.

The resilient fingers 30 resist insertion of the module 40 and store energy as they are deflected outwardly until the module 40 is latched to the receptacle 20. The module 40 may be released from the receptacle 20 by operating an actuator 60 of the module, as shown in FIG. 5. The actuator 60 is slidably mounted in a channel 62 of the module 40 and has a ramped portion 64 for deflecting the latching tab 42 by causing the leading edge 44 to be lifted until the latching member 48 is released from the latching tab 42. The resilient fingers 30 then resile and cause the module 40 to be at least partially ejected from the receptacle 20. This facilitates removal of the module from the receptacles and disconnection of the module from the receptacle connector 90.

In this manner, the invention provides a robust pluggable connector suitable for miniaturization and use in high-frequency data transmission applications by providing adequate EMI shielding, reliable, non-intrusive chassis grounding, adequate ventilation, and conventional pluggability.

Referring to FIGS. 10 through 12, another embodiment of the receptacle of the present invention is shown. The embodiment of these figures has all of the features described above with respect to pluggable module and receptacle system shown in FIGS. 1 through 9, in fact, it contains the same or only slightly-modified components of those embodiments, except this embodiment is intended to accommodate bezel opening offset. Specifically, in certain applications, for example, as specified in the PCI local bus specification, revision 2.2, the bottom 1003a of the bezel opening 1003 is not on the same plane as the top of the host circuit board 1005. Rather, there is a certain distance or bezel opening offset between the bottom of the bezel opening and the top of the circuit board 1005. The receptacle of the present invention is able to accommodate this bezel opening offset by mounting to the host circuit board at an angle such that the front 1007 of the receptacle 1001 is tilted upward.

Tilting the receptacle cage may be accomplished in different ways. Preferably, one or more standoffs 1002 are used near the front 1007 of the receptacle. These standoffs rest on the top of the host circuit board 1004 and prevent the front 1007 of the receptacle from seating on the host circuit board, while allowing the rear 1010 of the receptacle to seat on the host circuit board and minimize the gap 1005. As shown, the standoffs may be sections of the receptacle that are stamped and bent downward from the housing. Alternatively, the standoffs may be a discrete part which is added to the receptacle. It is also anticipated that, rather than having the standoff extend downward from the receptacle 1001, the host circuit board 1004 may be configured with bumps or ridges that serve to raise the front end of the receptacle.

FIGS. 11 and 12 shown different configurations of the lower portion 1001a, 1001b, respectfully, of the receptacle 1001. Specifically, FIG. 11 shows a bottom section 1001a suitable for wave flow installation techniques. To this end, the lower portion 1001a comprises elongated members 1101 which are adapted to pass through the host circuit board and extend from the bottom thereof to facilitate waves soldering. It is worthwhile to mention that due to the tilting of the receptacle of the present invention, elongated numbers 1101 need to be longer than those of a receptacle which is mounted adjacent the host circuit board (see, e.g., the embodiment of FIG. 1). The longer elongated members require cutting larger sections from the housing in preparation thereof. FIG. 12 shows a lower portion 1001b which is configured for intrusive reflow soldering. To this end, the lower portion 1001b has a number of elongated members 1201 which extend from the sides but not so far that they extend through the host circuit board. Due to the fact that less material is used in the preparation of the elongated members 1201, as compared to those elongated members 1101 of FIG. 11, this embodiment is preferred from an EMI emission standpoint. That is, since less material is cut from the housing to form the elongated members 1201, the bottom section of the housing is not as perforated as that of FIG. 11 and thus its EMI shielding is higher.

Tilting the receptacle to accommodate variations in the bezel opening height from the host circuit board offers a number of advantages. First, it minimizes EMI emissions by minimizing the gap 1005 which is immediately adjacent to the bottom opening 37 that accommodates the receptacle connector 90 (see, e.g., FIGS. 2 & 3). By minimizing this gap 1005, the EMI path is thereby minimized. If the receptacle 1001 was not tilted but, instead, was maintained in a parallel arrangement to the host circuit board 1004, then the gap 1005 would necessarily be wider and thus more prone to allow passage of EMI. Aside from the housing being open in this area, this is also the area in which the electrical signals are electrically coupled between the module and the host circuit board. This coupling action is a source of EMI, particularly at high operating frequencies. Thus, the rear of the receptacle tends to be a particularly prone to EMI activity. Minimizing gaps by keeping this portion as close to the host circuit board as possible provides effective shielding to combat this EMI tendency.

Another advantage of tilting the cage to accommodate different bezel opening configurations is the ability to minimize retooling of the receptacle components of FIG. 1. Specifically, titling the receptacle 1001 takes advantage of the tolerance of the receptacle connector 90 to receive a module at various angles. For example, as shown in FIG. 10, the receptacle is at a 1° angle which is adequate for the receptacle connector to interface with the module. Consequently, the embodiment of FIGS. 10 through 12 use the same receptacle connector as used in the embodiment of FIG. 1. Furthermore, since the lower portion 1001a is only slightly different from that of FIG. 1, the upper portion 1009 is able to interface with the lower portion 1001a with no modification thereto. Using the same components (particularly the same receptacle connector) for the various embodiments of the receptacle system of the present invention not only saves costs from a manufacturing and inventory perspective, but also ensures that the electrical performance of the module in the host system remains the same. Thus, the same modules can be used in tilted and non-tilted systems without experiencing any significant performance variation.

What is claimed is:

1. A receptacle for receiving a module and electrically connecting said module to a host circuit board mounted within a chassis of a host system, said chassis having a bezel opening which has an offset a certain distance above said host circuit board, said receptacle comprising:
    a housing having a front and rear, a back wall, a top wall, a bottom wall, and side walls and defining a cavity for receiving a module, said bottom wall having a bottom opening to receive a receptacle connector, said front having a front opening to receive said module, the walls comprising a conductive material;
    a plurality of elongated members extending down from said housing past said bottom wall and adapted for electrical connection to a host circuit board such that said walls are electrically connected to said host circuit board;
    at least one standoff extending down from said housing, said standoff being more toward said front of said housing than said rear, when said housing is mounted to said host circuit board, said standoff contacts said circuit board and causes said front of said housing to be raised above said rear of said housing, said front of said housing being raised above said host circuit board by a distance approximately that of said offset.

2. The receptacle of claim 1, wherein said standoff extends downward from said housing at a length sufficient for said front of said housing to be raised above said rear of said housing at about 1°.

3. The receptacle of claim 1, wherein said housing comprises two standoffs, one on each of said side walls.

4. The receptacle of claim 1, wherein said bottom wall covers at least about 50% of the bottom area of said receptacle.

5. The receptacle of claim 1, wherein at least one elongated containment member extends from said housing between two of said elongated members, said containment member being electrically conductive and electrically connected to said walls.

6. The receptacle of claim 1, wherein a plurality of containment members are disposed adjacent said bottom opening.

7. The receptacle of claim 6, wherein said elongated members are asymmetrically located on each side of said receptacle and said containment members are symmetrically located on each side of said receptacle.

8. The receptacle of claim 1, wherein said housing further comprises grounding tabs disposed at said front of said housing to effect an electrical connection with said bezel of said host system when said receptacle is mounted to said host circuit board, said grounding tabs being cantilevered mounted and extending backwards to a free, distal end.

9. The receptacle of claim 8, wherein said front of said housing comprises one or more stops extending outward from said housing to such a distance that they cannot be inserted through said bezel opening, said stops being located forward of the distal ends of said grounding tabs, therefore, said receptacle cannot be inserted through said bezel opening past the distal ends of said grounding tabs.

10. A pluggable module system comprising:
    a receptacle mounted to a host circuit board within a chassis of a host system, said chassis having a bezel opening which has an offset a certain distance above said host circuit board, said receptacle comprising a housing having a front and rear, a back wall, a top wall, a bottom wall, and side walls and defining a cavity for receiving a module, said bottom wall having a bottom opening to receive a receptacle connector, said front having a front opening to receive said module, the walls comprising a conductive material and being electrically connected to said host circuit board, said housing also comprising at least one standoff extending down from said housing, said standoff being more toward said front of said housing than said rear, when said housing is mounted to said host circuit board, said standoff contacts said circuit board and causes said front of said housing to be raised above said rear of said housing, said front of said housing being raised above said host circuit board by a distance approximately that of said bezel opening offset;
    a receptacle connector electrically connecting to said host circuit board and protruding into said cavity through said bottom opening, said receptacle connector being adapted for electrically connecting said module to said host circuit board; and
    a module comprising a module housing having a front end and a back end and being adapted for insertion into said receptacle and grounding contacts configured for electrical connection to said housing of said receptacle.

11. The receptacle of claim 10, wherein said standoff extends downward from said housing at a length sufficient for said front of said housing to be raised above said rear of said housing at about 1°.

12. The receptacle of claim 10, wherein said housing comprises two standoffs, one on each of said side walls.

13. The system of claim 10, wherein at least said top wall defines holes which are aligned in two or more rows running front to back thereby defining grounding paths of solid conductive material between the rows, and wherein said grounding paths and grounding contacts cooperate such that when said module is being inserted into said housing, said grounding contacts slide along said paths.

14. The system of claim 10, wherein said module comprises a circuit board within said module housing such that at least an edge portion of said module circuit board is accessible in a direction along the same plane as said module circuit board, the edge portion comprising pads on opposing sides of said module circuit board, the pads being suitable for forming an electrical connection with contacts in a mating connector; and said electrical connector comprising a slot for receiving said edge portion and at least two rows of contacts, one row of contacts extending upward into the slot and another row of contacts extending downward into the slot; the contacts being adapted to make an electrical connection with pads on said module circuit board when said module is inserted into the housing.

15. The system of claim 10, further comprising an ejection mechanism comprising a resilient member disposed adjacent the back of said housing, and a retention mechanism comprising a resilient latch disposed on said housing, an actuator slidably connected to said module, and a latching member extending from said housing for latching with said resilient latch, said ejection mechanism and said retention mechanism cooperating such that, when said module is inserted into said receptacle, the resilient member is loaded and said resilient latch engages said latching member, when said actuator is pushed backward, said actuator urges said resilient latch from said latching member thereby allowing the resilient member to unload thereby urging the module from the receptacle.

16. The system of claim 15, wherein said latching member is configured to shear if said module is forcibly pulled from the housing without releasing said latching mechanism.

17. The system of claim 15, wherein said resilient latch comprises an inclined leading edge for riding over the latching member of the module and interfering with a ramped portion of an actuator of the module.

* * * * *